United States Patent [19]

Bashir et al.

[11] Patent Number: 5,691,232

[45] Date of Patent: *Nov. 25, 1997

[54] PLANARIZED TRENCH AND FIELD OXIDE ISOLATION SCHEME

[75] Inventors: Rashid Bashir, Santa Clara; Francois Hebert, Sunnyvale; Datong Chen, Fremont, all of Calif.

[73] Assignee: National Semiconductor Corporation, Santa Clara, Calif.

[ * ] Notice: The term of this patent shall not extend beyond the expiration date of Pat. No. 5,411,913.

[21] Appl. No.: 563,862

[22] Filed: Nov. 29, 1995

Related U.S. Application Data

[63] Continuation of Ser. No. 212,967, Mar. 15, 1994, abandoned.

[51] Int. Cl.⁶ .................................................. H01L 21/76
[52] U.S. Cl. ........................................... 437/67; 437/924
[58] Field of Search ..................... 437/67, 924, 228 M, 437/228 TR; 148/DIG. 85, DIG. 86, DIG. 50; 257/510, 390, 391, 392, 393, 394, 395

[56] References Cited

U.S. PATENT DOCUMENTS

| | | | |
|---|---|---|---|
| 4,472,240 | 9/1984 | Kameyama | 156/648 |
| 5,385,861 | 1/1995 | Bashir et al. | |

FOREIGN PATENT DOCUMENTS

| | | | |
|---|---|---|---|
| 0 424 608 | 5/1991 | European Pat. Off. | |
| 0 424 608 A1 | 5/1991 | European Pat. Off. | H01L 21/76 |
| 57-204133 | 12/1982 | Japan | 437/67 |
| 59-177940 | 10/1984 | Japan | H01L 21/76 |
| 59177940 | 1/1985 | Japan | |
| 63-67747 | 3/1988 | Japan | 437/67 |

OTHER PUBLICATIONS

Kurosawa et al. *A New Bird's Beak Free Field Isolation Technology for VLSI Devices*, International Electron Devices Meeting, Dig. Tech., Paper, pp. 384–387 (1981).

Rung et al., *Deep Trench Isolated CMOS Devices*, International Electron Devices Meeting, Digest Technical Paper, pp. 237–240 (1982).

Katsumata et al., *Sub-20 ps ECL Bipolar Technology with High Breakdown Voltage*, ESSDERC, pp. 133–136 (Sep. 1983).

Lutze et al., *Electrical Characteristics of Advanced LOCOS Isolation for Deep Submicrometer CMOS*, IEEE Transactions on Electron Devices, vol. 38, No. 2, pp. 242–245 1991.

Poon et al., *A Trench Isolation Process for BiCMOS Circuits*, IEEE Bipolar Circuits and Technology Meeting 3.3, pp. 45–48 1993.

Kwasnick R.F. et al., "Buried-Oxide Isolation With Etch-Stop (Boxes)", IEEE Electron Device Letters, vol. 9, No. 2, Feb. 1988, pp. 62–64.

*Primary Examiner*—George R. Fourson
*Attorney, Agent, or Firm*—Limbach & Limbach L.L.P.

[57] ABSTRACT

An isolation method for separating active regions in a semiconductor substrate by combining field oxide formation with trench isolation is disclosed. Deep trenches are etched in a silicon substrate. An oxide layer is deposited over the entire substrate such that the oxide layer also fills the trenches that have been etched. Next, a layer of polysilicon is deposited over the wafer and etched back to form polysilicon spacers. These polysilicon spacers are used to align a photoresist mask that is used to etch the oxide overlying the active regions of the substrate, thereby resulting in fully planarized isolation regions with fully walled active regions.

15 Claims, 4 Drawing Sheets

PLANARIZED TRENCH AND FIELD OXIDE ISOLATION SCHEME

This is a continuation of application Ser. No. 08/212,967 filed on Mar. 15, 1994, now abandoned.

FIELD OF THE INVENTION

The present invention relates to an isolation process used to separate active device regions in integrated circuits. The process is particularly suitable to high density and high performance CMOS and bipolar devices.

BACKGROUND OF THE INVENTION

It is known in the prior art that individual active device regions on a semiconductor substrate may be separated from one another using a planar field oxide and a deep trench. Various field oxide isolation schemes have been proposed in the past, but many of these schemes have problems associated with "bird's beak" and "bird's head" formations. The "bird's beak" formation results from the lateral oxidation under the nitride masks used in the standard LOCOS (localized oxidation of silicon) procedure. The "bird's head" formation results from the lateral oxidation under the nitride masks used in the recessed or etch back LOCOS procedures. In fact, the walls of the recessed portions adjacent to the nitride masks, according to these procedures, greatly facilitate the lateral oxidation. These formations ("bird's beak" and "bird's head") encroach upon the active device area and thereby require greater distances between devices to compensate for this encroachment and result in a considerable reduction of packing density.

Various methods have been proposed to attempt the overcome this problem. One such method, referred to as "BOX", has been proposed by Kurosawa et al, "A New Bird's-Beak Free Field Isolation Technology for VLSI Devices", International Electron Devices Meeting, Dig. Tech. Paper, pp. 384–387 (1981). The name "BOX" has been given to this method because it involves burying oxide into etched grooves formed in silicon substrates. According to this method, the silicon substrate is etched in the field region using reactive ion etching (RIE) leaving a layer of aluminum covering the active device areas. Then, $SiO_2$ is plasma deposited over the entire substrate. The $SiO_2$ fills up the portion of the substrate previously etched away and also covers the aluminum layer.

The plasma-deposited silicon dioxide is subjected to a lift-off technique using buffered HF solution. This leaves V-shaped grooves in the periphery of the active region. The silicon dioxide on top of the aluminum mask is lifted off by etching. Then, the remaining V-shaped grooves are buried with silicon dioxide in a second step. This is accomplished by chemical vapor deposition (CVD) of silicon dioxide followed by a surface leveling technique using a spin-coated resist. The resist and silicon dioxide layers are simultaneously etched by RIE. The oxide surfaces are then smoothed and any oxide remaining on the active device region must be removed by solution etching.

The problem with the BOX method is that it is too complex and cannot be performed efficiently and reliably. First of all, a two step oxide burying technique is needed, which is more time consuming than a single oxide deposition step. Furthermore, resist planarization and resist etch back steps are involved. These steps are difficult to control to close tolerances in a manufacturing environment. Resist planarization and etch-back techniques are not effective and are difficult to achieve for large active areas.

Another trench isolation method known in the prior art was disclosed in a publication by Rung et al. entitled, "Deep Trench Isolated CMOS Devices," International Electron Devices Meeting, Digest Technical Paper, pp. 237–240. According to this method, trenches are formed by RIE and are filled with silicon dioxide or poly-silicon deposited by using low pressure chemical vapor deposition (LPCVD). Once the trenches are filled, a critical etch back step must be accomplished using end point detection. After the etch back step, a capping oxidation step is performed using nitride as an oxidation mask.

Yet another method is disclosed by Katsumata et al., in "Sub-20 ps ECL Bipolar Technology with High Breakdown Voltage", ESSDERC (September 1993). In this paper, the authors disclose a shallow and deep trench isolation method using Low-Temperature Oxide Filling. According to this method, shallow and deep trenches are etched and then filled with liquid oxide deposition, a technique not yet fully established. A photoresist mask is then formed over the field areas and the exposed portions of the oxide layer are etched. Next, a second step of liquid oxide deposition is performed, followed by another etch back step. Hence, this process uses a critical alignment step and two liquid oxide deposition and etch back steps, all of which are not easily manufacturable. The above-mentioned problems with respect to large active areas apply here as well.

SUMMARY OF THE INVENTION

The present invention is directed toward a novel device isolation scheme that is applicable to high density, high performance CMOS and bi-polar processes, while overcoming the problems associated with the prior art.

According to a preferred embodiment of the present invention, deep trenches are etched in a silicon substrate. An oxide layer is deposited over the entire substrate such that the oxide layer also fills the trenches that have been etched. Next, a layer of polysilicon is deposited over the wafer and etched back to form polysilicon spacers. These polysilicon spacers are used to align a photoresist mask that is used to etch the oxide overlying the active regions of the substrate.

Accordingly, the present invention combines field oxide formation with trench isolation. The oxide filled trench lowers the overall capacitance. No trench planarization is required and no long thermal cycle is needed. The resulting structure has fully-walled junctions and there is no "bird's head" or "bird's beak" formation. Also, significantly, unlike the prior art, the alignment step to etch the oxide over the active regions is very non-critical due to the novel use of spacers.

BRIEF DESCRIPTION OF THE DRAWINGS

FIG. 1 illustrates a substrate having a layer of pad oxide, nitride and LTO deposited thereon.

FIG. 2 illustrates the structure of FIG. 1 after a deep trench has been etched and the LTO removed.

FIG. 3 illustrates the structure of FIG. 2 with a layer of pad oxide grown over the exposed areas of the substrate.

FIG. 4 illustrates the structure of FIG. 3 with a layer of oxide deposited over the entire substrate.

FIG. 5 illustrates the structure of FIG. 4 with polysilicon spacers formed on certain portions of the oxide layer.

FIG. 6 illustrates the structure of FIG. 5 with a photoresist mask aligned on top of and within the width of the polysilicon spacers.

FIG. 7 illustrates the structure of FIG. 6 after the oxide layer has been selectively etched.

FIG. 8 illustrates the structure of FIG. 7 after the photoresist has been removed and the polysilicon spacers have been selectively wet-etched.

FIG. 9 illustrates the structure of FIG. 8 after the layer of nitride has been etched.

DETAILED DESCRIPTION OF THE PREFERRED EMBODIMENTS

An isolation scheme according to a preferred embodiment of the present invention will now be discussed with respect to FIGS. 1–9.

Figure 1:
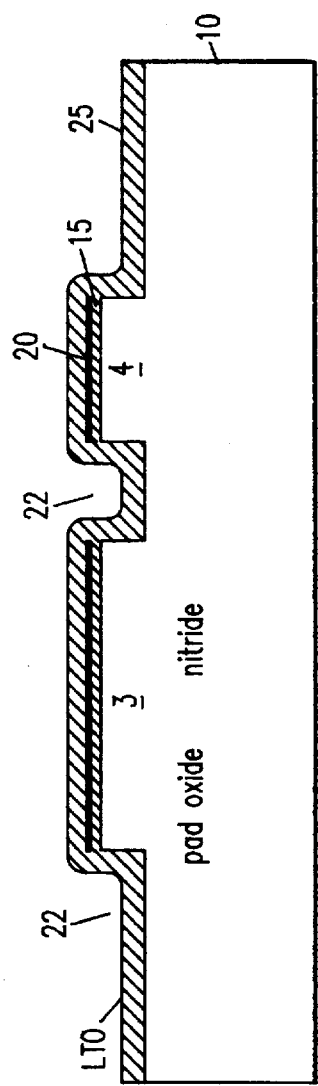
FIGS. 1 through 9 illustrate an isolation scheme according to the present invention. The specific steps in the scheme are illustrated in the figures as follows.
Figure 2:
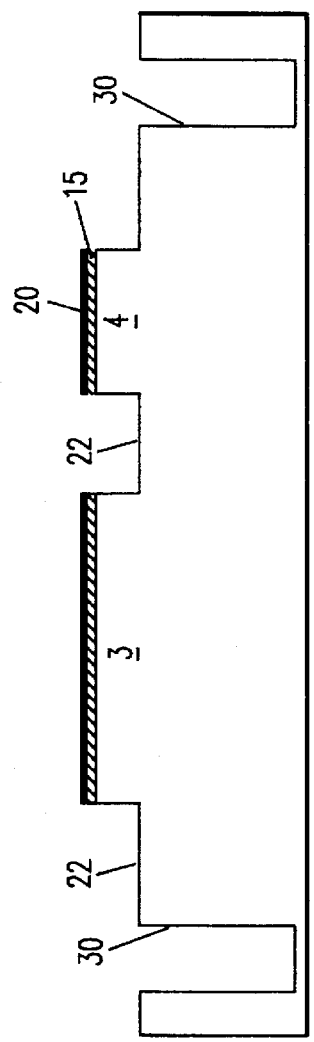

As shown in FIG. 1, a pad oxide layer 15 and a nitride layer 20 are deposited on a silicon substrate 10. The pad oxide layer 15 has a thickness in the range of 300 to 1000 Angstroms; preferably, a layer 500 Angstroms thick is used. The nitride layer is within the range of 1000 to 2000 Angstroms, preferably being 1000 Angstroms thick. The nitride layer 20, pad oxide layer 15 and the silicon substrate 10 are etched using a photoresist mask (not shown) to form active regions 3 and 4. Substrate regions, other than active regions 3 and 4 will be referred to as non-active regions. The etch should be anisotropic and preferably should extend into the silicon substrate for a depth of about 1.0 micrometers to form shallow trenches 22. The photoresist is stripped off and a low temperature deposited oxide layer (LTO) 25, or another suitable insulator, is deposited over the entire substrate 10 and serves as a hard mask that will be used for trench etching. The LTO 25 is preferably deposited to a thickness of 7000 Angstroms, but a range of thicknesses between 4000 and 7000 Angstroms is suitable.

Etching of the nitride and oxide layers may be performed by using suitable chemistries such as $CHF_3+C_2F_6$, $CHF_3+CF_4$, or $CF_4+H_2$ in an RIE (reactive ion etching) system. The silicon substrate may be etched using $SF_6+Cl_2$.

LTO 25 is masked and etched to open trench windows and thereby forming an LTO hard mask. Next, deep Si trenches 30 are etched in a magnetically enhanced RIE system using the LTO as a mask. Once these deep trenches 30 are formed, the LTO is etched off using a wet aqueous solution. The depth of deep trenches 30 is dependent upon the application for which it is to be used and is easily adjustable.

Figure 3:
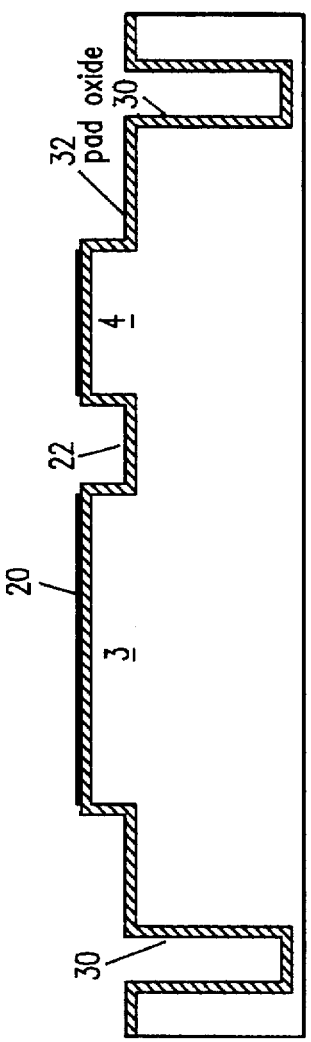

As shown in FIG. 3, a thin pad oxide layer 32 can be grown over the silicon substrate. Layer 32 could be stripped off and regrown from the active areas of the substrate which are covered by the nitride layer 20. The pad oxide serves to heal any damage that may have occurred due to the reactive ion etching (RIE).

Figure 4:
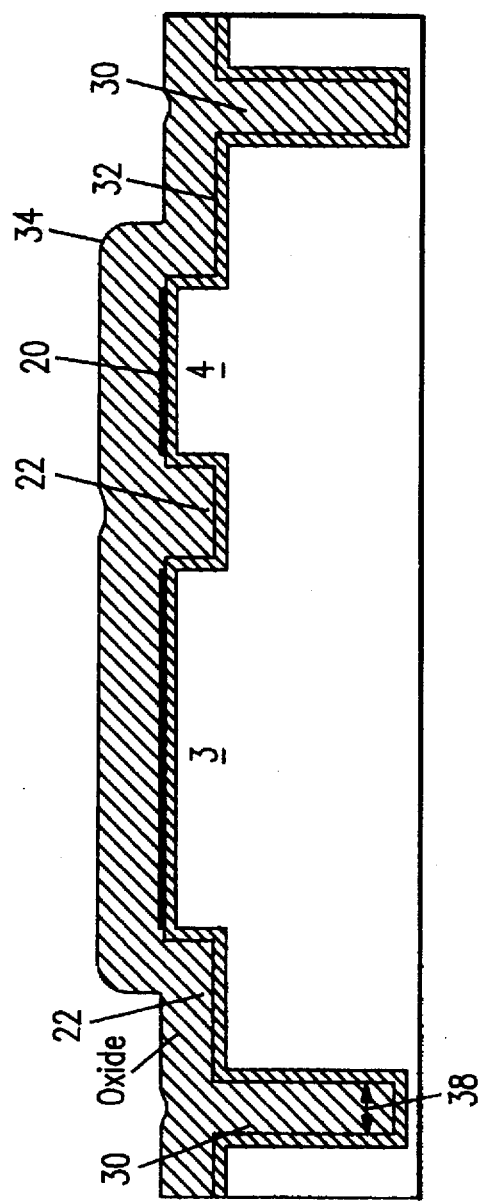

As shown in FIG. 4, a thick oxide layer 34 is deposited over the entire substrate (this oxide layer may be another LTO layer or a thermal TEOS (deposited by the decomposition of tetraethyl orthosilicate) ozone deposited oxide layer). Preferably, oxide layer 34 is 1.0 micrometers thick and is conformal. The width 38 of trenches 30 should be such that the oxide layer completely fills these trenches. A trench with a width 38 of 1 micrometer would be suitable. If desired, a thermal cycle may be used to densify oxide layer 34.

Figure 5:
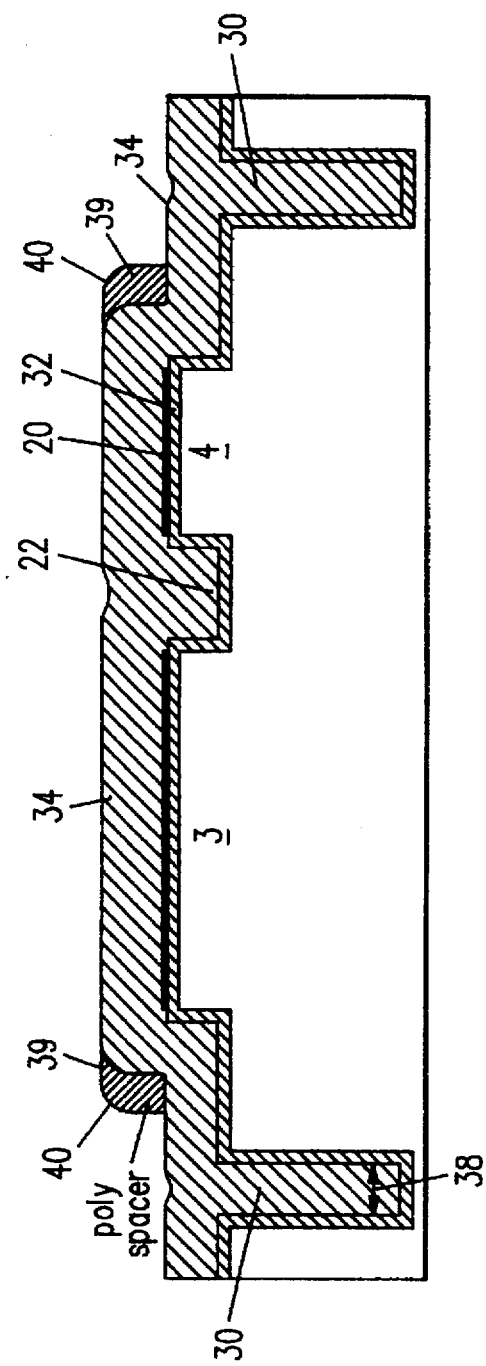

Next, a polysilicon layer is deposited over oxide layer 34. The polysilicon layer is then anisotropically etched to leave spacers 40 on the shoulder regions 39 of oxide layer 34. Spacers 40 are laterally displaced from the active regions 3 and 4 by a distance approximately equal to the thickness of the oxide layer. The polysilicon layer is preferably 1 micrometer thick, but a range of 1 to 1.5 micrometers would be suitable. The etch is stopped with an automatic end point detection scheme on oxide layer 34. The resulting structure is shown in FIG. 5.

Figure 6:
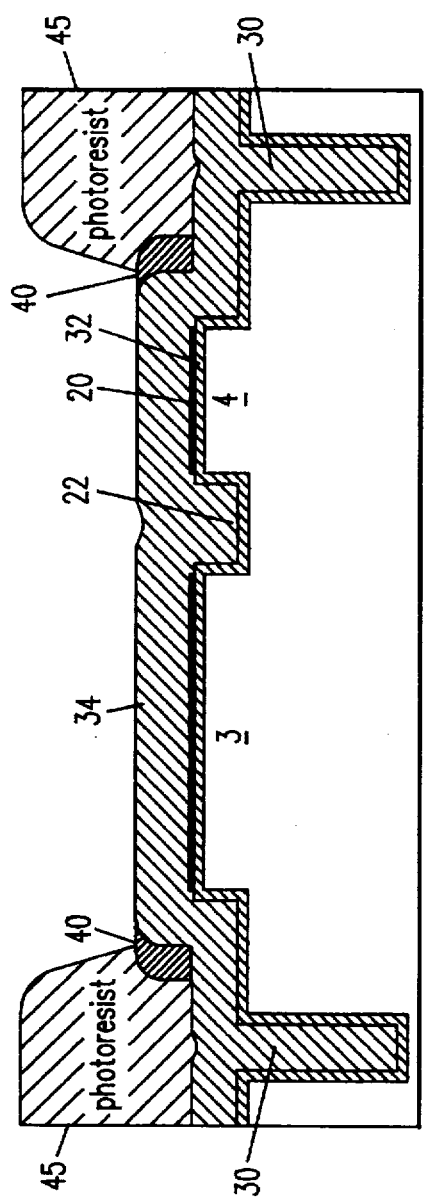

As shown in FIG. 6, a photoresist mask 45 is aligned within the polysilicon spacers 40. The alignment can be accomplished by a stepper such as the ASM PAS 2500/40 manufactured by ASM Lithography. The width of spacers 40 should be enough to tolerate some misalignment of the stepper. The stepper alignment capability should be within 0.1 micrometer.

Figure 7:
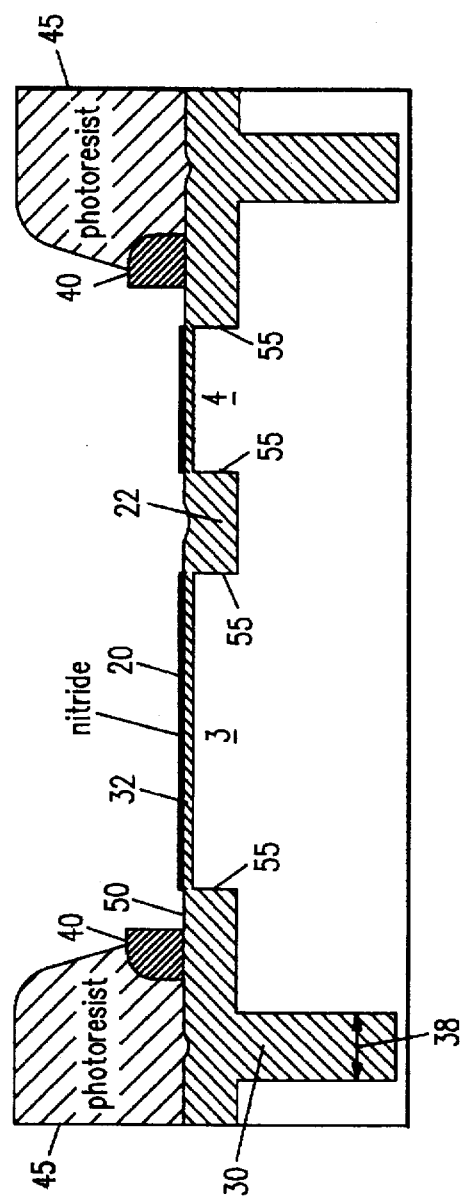

An anisotropic oxide etch, which is selective to polysilicon and nitride, can be used to etch away a portion of the oxide layer 34 that lies over the active regions of the substrate, producing the result shown in FIG. 7. The entire thickness of the oxide layer 34, which in the preferred embodiment is 1 micrometer, is etched during this step using an automatic end point detection scheme. The active regions of the substrate are protected by nitride layer 20. Also, spacers 40 act as a self-aligned mask permitting the oxide next to these spacers, such as at point 50, to be etched and thereby resulting in a planar field oxide relative to the active regions 3 and 4. Also, walls 55 of active regions 3 and 4 are fully covered with oxide, without any encroachment into these active regions.

Figure 8:
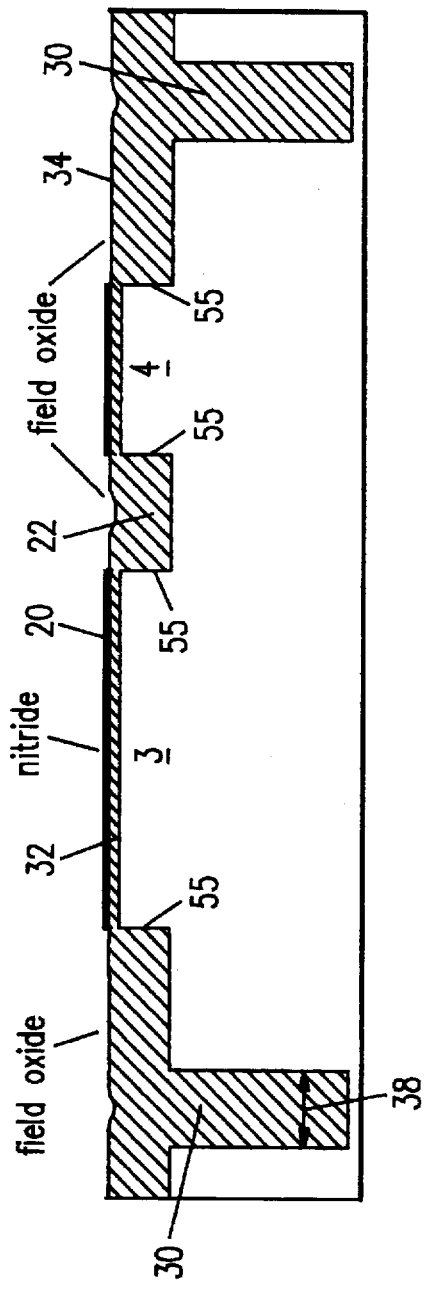

FIG. 8 shows the resulting structure after the photoresist mask 45 is removed and the polysilicon spacers 40 have been etched off by using an isotropic plasma polystrip or wet poly etch that is selective to oxide and nitride.

Figure 9:
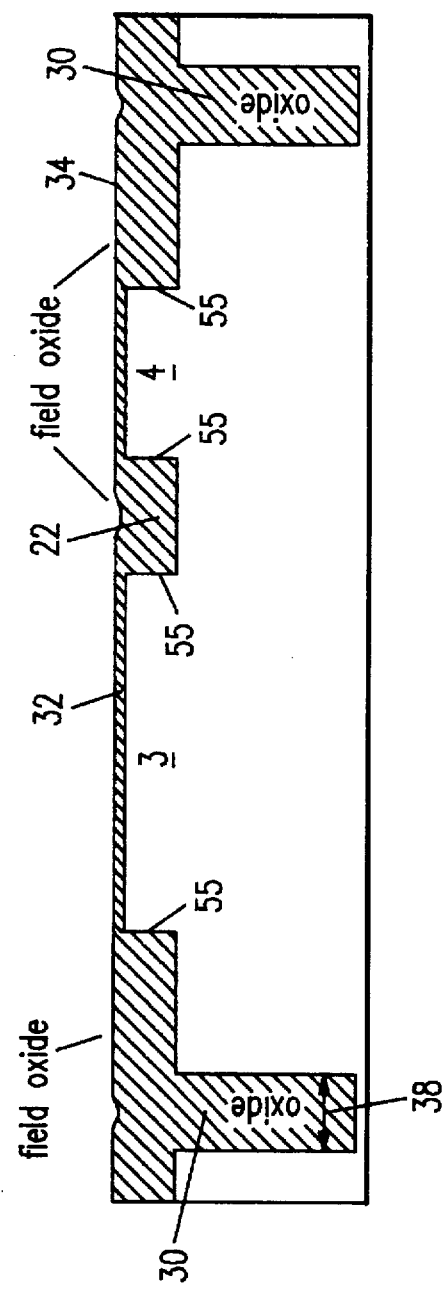

Finally, nitride layer 20 can be stripped off using well known plasma or hot phosphoric etching techniques and subsequent processing can be continued with the structure shown in FIG. 9. Thus, a fully planar field oxide structure with fully-walled active regions is obtained. The oxide also fills the deep trenches 30 and the need for planarization is obviated. The oxide filled trenches provide lower capacitances and the fully walled active regions completely eliminate the undesirable "bird's beak" effect.

Importantly, unlike the prior art, the masking step required to etch oxide on top of the active areas is very non-critical. Also, no long thermal cycle is needed.

Alternatively, the above described process can be performed without deep trenches 30. The result would be planar, fully-walled oxide isolation regions which completely eliminate the undesirable "bird's beak" phenomenon. Also, trench isolation using other more conventional process flows can be performed after the formation of the planar field oxide isolation.

While the present invention has been disclosed above with particular reference to the preferred embodiments shown, those embodiments are presented by way of example, not by way of limitation. Those of ordinary skill in the art would be enabled by this disclosure to add or to modify these embodiments of the invention in various ways as needed and still be within the scope and spirit of the present invention as recited in the appended claims.

What is claimed is:

1. An isolation method for separating active regions on a silicon substrate by combining field oxide formation with trench isolation, the isolation method comprising the steps of:

depositing a layer of pad oxide on the substrate;

depositing a layer of nitride on the pad oxide;

defining active and non-active regions on the substrate by using a first photoresist mask;

removing the layer of pad oxide and the layer of nitride from the non-active regions of the substrate;

etching the substrate to a defined depth in the non-active regions;

patterning a low temperature oxide (LTO) hard mask to define one or more trench regions in the non-active regions;

etching the one or more trenches as defined;

removing the LTO layer from the substrate;

depositing an oxide layer, of a defined thickness, over the substrate such that the oxide layer fills the one or more trenches and forms steps as a result of the etching the substrate step;

depositing a layer of polysilicon over the oxide layer;

etching the polysilicon layer to form spacers on the sides of the steps; and aligning a second photoresist mask on top of the oxide layer having edges over the polysilicon spacers such that a portion of the oxide layer overlying the active area may be etched.

2. The method according to claim 1, further comprising the steps of:

removing the portion of the oxide layer overlying the active area;

removing the second photoresist mask; and removing the polysilicon spacers.

3. The method according to claim 2, wherein the spacers are laterally displaced from the active regions by a distance approximately equal to the thickness of the oxide layer.

4. The method according to claim 3, wherein the oxide layer is deposited using thermal TEOS or plasma enhanced TEOS (PETEOS).

5. The method according to claim 4, wherein the oxide layer is deposited to a thickness that is equal to the field oxide thickness.

6. The method according to claim 1 wherein the step of etching the polysilicon layer is accomplished by reactive ion etching (RIE).

7. The method according to claim 6, wherein the defined depth to which the substrate is etched is equal to 1 µm.

8. An isolation method for separating active regions on a silicon substrate by combining field oxide formation with trench isolation, the isolation method comprising the following sequence of steps:

depositing a first layer of pad oxide on the substrate;

depositing a layer of nitride on the pad oxide;

defining active and non-active regions on the substrate by using a first photoresist mask;

removing the layer of pad oxide and the layer of nitride from the non-active regions of the substrate;

etching the substrate to a defined depth in the non-active regions;

patterning an LTO hard mask to define one or more deep trench regions in the non-active regions;

etching the one or more trenches as defined;

removing the LTO layer from the substrate;

depositing an oxide layer, of a defined thickness, over the substrate such that the oxide layer fills the one or more trenches and forms steps as a result of the etching the substrate step;

depositing a layer of polysilicon over the oxide layer;

etching the polysilicon layer to form spacers on the sides of the steps; and aligning a second photoresist mask on top of the oxide layer having edges over the polysilicon spacers such that a portion of the oxide layer overlying the active area may be etched.

9. The method according to claim 8, further comprising the following sequence of steps to be performed after the step of aligning a second photoresist mask:

removing the portion of the oxide layer overlying the active area;

removing the second photoresist mask; and removing the polysilicon spacers.

10. The method according to claim 9, further comprising a step of depositing a second layer of pad oxide that is performed after the step of etching the LTO layer from the substrate and before the step of depositing an oxide layer on the substrate.

11. The method according to claim 10, wherein the spacers are laterally displaced from the active regions by a distance approximately equal to the thickness of the oxide layer.

12. The method according to claim 11, wherein the oxide layer is deposited using thermal TEOS or plasma enhanced TEOS (PETEOS).

13. The method according to claim 12, wherein the oxide layer is deposited to a thickness that is equal to the field oxide thickness.

14. The method according to claim 13, wherein the step of etching the polysilicon layer is accomplished by reactive ion etching (RIE).

15. The method according to claim 14, wherein the defined depth to which the substrate is etched is equal to 1 µm.

* * * * *

UNITED STATES PATENT AND TRADEMARK OFFICE
CERTIFICATE OF CORRECTION

PATENT NO. : 5,691,232
DATED : November 25, 1997
INVENTOR(S) : RASHID BASHIR et al.

It is certified that error appears in the above-identified patent and that said Letters Patent is hereby corrected as shown below:

In Col. 5, line 38, delete "1" and replace with --5,--.

Signed and Sealed this

Third Day of February, 1998

BRUCE LEHMAN

Attest:

Attesting Officer

Commissioner of Patents and Trademarks